(12) United States Patent
Macours

(10) Patent No.: US 10,165,364 B2
(45) Date of Patent: Dec. 25, 2018

(54) LINEAR RESONANT ACTUATOR CONTROLLER

(71) Applicant: NXP B.V., Eindhoven (NL)

(72) Inventor: Christophe Marc Macours, Hodelge (BE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/798,653

(22) Filed: Oct. 31, 2017

(65) Prior Publication Data

US 2018/0139538 A1    May 17, 2018

(30) Foreign Application Priority Data

Nov. 14, 2016 (EP) ..................... 16198575

(51) Int. Cl.
H04R 3/04    (2006.01)
H03F 3/183   (2006.01)
G03G 5/16    (2006.01)
H04R 17/10   (2006.01)
H03G 5/16    (2006.01)
(Continued)

(52) U.S. Cl.
CPC ............ *H04R 3/04* (2013.01); *G10L 21/0208* (2013.01); *H03F 3/183* (2013.01); *H03F 3/217* (2013.01); *H03G 5/165* (2013.01); *H04R 17/10* (2013.01); *G06F 3/016* (2013.01); *G06F 3/041* (2013.01); *G10L 21/0232* (2013.01); *H03F 2200/03* (2013.01); *H04R 2400/03* (2013.01)

(58) Field of Classification Search
CPC . H04R 3/00; H04R 3/04; H04R 17/10; H04R 2400/03; G06F 3/016; G06F 3/041; G10L 21/00; G10L 21/0208; G10L 21/0232; H03F 3/183; H03F 3/217; H03F 2200/03; H03G 5/165
See application file for complete search history.

(56) References Cited

U.S. PATENT DOCUMENTS 6,809,635 B1   10/2004 Kaaresoja
9,686,608 B2   6/2017  Macours et al.
(Continued)

FOREIGN PATENT DOCUMENTS

EP    1 051 058 A2   11/2000
EP    2 698 970 A1   10/2012
KR    100835962 B1   6/2008

OTHER PUBLICATIONS

ETSI 3rd Generation Partnership Project; TS126.131 v. 8.3.0 Release 8; 29 pages (Apr. 2011).
(Continued)

*Primary Examiner* — Thang V Tran

(57) ABSTRACT

A linear resonant actuator controller for a mobile device having a linear resonant actuator is described. The linear resonant actuator controller comprises a controller output configured to be coupled to a linear resonant actuator; an audio processor having an audio processor input and an audio processor output coupled to the controller output. The audio processor is configured to receive an audio signal comprising speech, to process the audio signal by attenuating the audio signal frequency components at the resonant frequency of the linear resonant actuator with respect to at least some other audio signal frequency components, and to output the processed audio signal on the audio processor output.

15 Claims, 6 Drawing Sheets

(51) Int. Cl.
*H03F 3/217* (2006.01)
*G10L 21/0208* (2013.01)
*G06F 3/041* (2006.01)
*G06F 3/01* (2006.01)
*G10L 21/0232* (2013.01)

(56) References Cited

U.S. PATENT DOCUMENTS

| | | | | |
|---|---|---|---|---|
| 2007/0236449 | A1* | 10/2007 | Lacroix | G06F 3/016 345/156 |
| 2012/0206247 | A1* | 8/2012 | Bhatia | G06F 3/016 340/407.1 |
| 2012/0229264 | A1* | 9/2012 | Company Bosch | G06F 3/016 340/407.1 |
| 2014/0064516 | A1* | 3/2014 | Cruz-Hernandez | G08B 6/00 381/98 |
| 2014/0119569 | A1 | 5/2014 | Peeler et al. | |
| 2014/0167941 | A1 | 6/2014 | Rank et al. | |
| 2014/0176415 | A1* | 6/2014 | Buuck | G06F 3/016 345/156 |
| 2014/0292501 | A1* | 10/2014 | Lim | G08B 6/00 340/407.2 |
| 2017/0053502 | A1* | 2/2017 | Shah | G08B 6/00 |
| 2017/0083094 | A1* | 3/2017 | Hajati | G06F 3/016 |
| 2017/0111734 | A1* | 4/2017 | Macours | H04R 3/005 |

OTHER PUBLICATIONS

Brigadier; "Smart Sonic Receiver Technology"; retreived from the Internet https://www.kyoceramobile.com/brigadier/Brigadier-Smart-Sonic-Receiver-Technology.pdf; 2 pages (Oct. 23, 2017).

Liu, Zicheng et al; "Direct Filtering for Air- and Bone-Conductive Microphones"; Microsoft Research; IEEE 6th Annual Workshop on Multimedia Signal Processing; 4 pages (2004).

* cited by examiner

500

550

LINEAR RESONANT ACTUATOR CONTROLLER

CROSS-REFERENCE TO RELATED APPLICATIONS

This application claims the priority under 35 U.S.C. § 119 of European patent application no. 16198575.9, filed Nov. 14, 2017 the contents of which are incorporated by reference herein.

This disclosure relates to linear resonant actuator controllers for mobile devices.

The increasing adoption of wideband speech for mobile communication imposes new acoustical requirements for mobile phones and other mobile devices. In a handset calling mode, the required receiving sensitivity frequency response is determined for example for 3G mobile phones by the ETSI 3rd Generation Partnership Project (3GPP) (3GPP TS 26.131 version 8.3.0 Release 8, April 2011). The receiver or earpiece speaker of a mobile phone and audio processing is typically designed to meet these requirements.

Various aspects of the disclosure are defined in the accompanying claims. In a first aspect there is defined a linear resonant actuator controller for a mobile device having a linear resonant actuator and a handset call mode, the linear resonant actuator controller comprising: a controller output configured to be coupled to a linear resonant actuator; an audio processor having an audio processor input and an audio processor output coupled to the controller output; wherein the audio processor is configured to receive an audio signal comprising speech, to process the audio signal by attenuating the audio signal frequency components at the resonant frequency of the linear resonant actuator with respect to at least some other audio signal frequency components, and to output the processed audio signal on the audio processor output.

In embodiments, the linear resonant actuator controller may further comprise a haptic driver having a haptic driver input and a haptic driver output; wherein the linear resonant actuator controller is further configured to: in a first mode couple the haptic driver output to the controller output, in a second mode couple the audio processor output to the controller output.

In embodiments of the linear resonant actuator controller, the audio processor may be configured to equalize and compress the audio signal before output on the audio processor output.

In embodiments, the linear resonant actuator controller may further comprise a further controller output configured to be coupled to one of a receiver speaker and a piezo-transducer, wherein the audio processor comprises a further audio processor output coupled to the further controller output and wherein the audio processor is further configured to process the received audio signal and to output a further processed audio signal on the further audio processor output.

In embodiments of the linear resonant actuator controller, the audio processor may be configured to generate a processed audio signal by applying a first equalization and compression to the audio signal and to generate a further processed audio signal by applying a second equalization and compression to the audio signal.

In embodiments the first equalization and compression may comprise a low pass filter and the second equalization and compression may comprise a high pass filter.

In embodiments, the audio processor may further comprise: a sensor input configured to receive a sensor input signal comprising at least one of a user contact position value, a user proximity value, and a user contact force value, wherein the audio processor is further configured to adapt the audio signal processing in dependence of the sensor input signal.

Embodiments of the linear resonant actuator controller may be included in a mobile device comprising a linear resonant actuator coupled to the controller output.

In embodiments, a mobile device may further comprise a linear resonant actuator coupled to the controller output and one of a receiver speaker and a piezo transducer coupled to a further controller output.

In embodiments, a mobile device may comprise a linear resonant actuator controller and further comprise a linear resonant actuator coupled to the controller output and a touch screen coupled to a sensor input of the linear resonant actuator controller, wherein the touch screen is configured to provide a sensor input signal comprising at least one of a user contact position value and a user contact force value in response to a user being in contact with the touch screen.

The linear resonant actuator may have a Q-factor of greater than 15.

In a second aspect there is described method for controlling a mobile device including a linear resonance actuator, the method comprising: processing an audio signal comprising speech for transmission by a linear resonant actuator by attenuating the audio signal frequency components at the resonant frequency of the linear resonant actuator with respect to at least some other audio signal frequency components.

In embodiments, the audio signal may be processed for transmission by a receiver speaker.

In embodiments, the audio signal may be processed by equalising and compressing the audio signal.

In embodiments, the audio signal may be processed by applying a first equalization and compression to the speech signal before transmission by a linear resonance actuator, applying a second equalization and compression to the speech signal before transmission by a receiver speaker, wherein the first equalization comprises a low pass filtering operation and the second equalization comprises a high pass filtering operation.

In a third aspect there is described a computer program product comprising instructions which, when being executed by a processing unit, cause said processing unit to perform the steps of processing an audio signal comprising speech for transmission by a linear resonant actuator by attenuating the audio signal frequency components at the resonant frequency of the linear resonant actuator with respect to at least some other audio signal frequency components.

BRIEF DESCRIPTION OF DRAWINGS

In the figures and description like reference numerals refer to like features. Embodiments of are now described in detail, by way of example only, illustrated by the accompanying drawings in which:

FIG. 1 shows a linear resonant actuator controller 100. The linear resonant actuator controller 100 includes a haptic driver 104, a switch module 108, an audio processor 110, and an audio amplifier 118. A haptic driver input 102 is connected to haptic driver or amplifier 104. The output 106 of the haptic driver 104 is connected to a first input of switch module 108. An audio input 112 is connected to audio processor 110. An audio output 116 of audio processor 110 may be connected to audio amplifier 118, which may for example be a class-D amplifier. An output 120 of the audio amplifier 118 is connected to a second input of the switch module 108. An output of the switch module 108 is connected to the controller output 122 of the linear resonant actuator controller 100. A control input 114 of the audio processor 110 may be connected to control input of the switch module 108.

Figure 1:
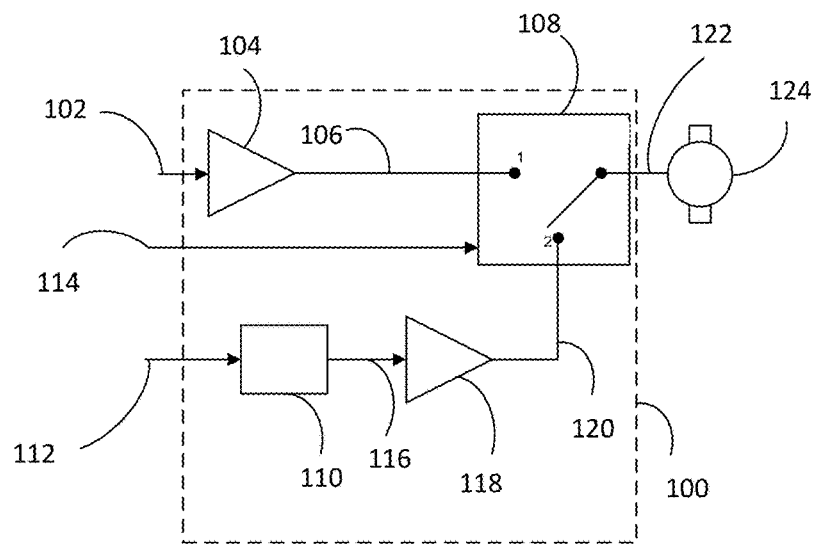
FIG. 1 shows a linear resonant actuator controller according to an embodiment.

In operation, the controller output 122 may be connected to a linear resonant actuator 124. Linear resonant actuators are typically used as haptic motors for generating vibration alerts, or more complex haptic patterns, to enhance man-device interaction. Recent mobile devices make use of an AC-driven Linear Resonant Actuator (LRA) as opposed to a DC-driven Eccentric Rotating Mass (ERM) motor, which may also be used as haptic motors. Linear resonant actuators are capable of producing more complex haptic effects and may be driven in the same way as a loudspeaker. Linear resonant actuators are designed to resonate a specific frequency for example 200 Hz, which is particularly suitable for haptic feedback, and typically have a high Q factor of 15 or more.

In a first operation mode of the linear resonant actuator controller 100 which may be referred to as a haptic mode, the haptic driver output 106 may be connected to the controller output 122 by an external controller (not shown) controlling the switch module 108 via switch control input 114. In the first mode, the linear resonant actuator controller 100 may drive the linear resonant actuator as designed, to act as a haptic motor for generating vibrations for example in a mobile phone. In a second operation mode, which may for example a handset mode in a mobile phone, the audio amplifier output 120 may be connected to the linear resonant actuator controller output 122 by controlling the switch module 108. The audio processor 110 may apply equalisation and/or compression to an audio signal received on the audio input 112 to attenuate the signal frequencies at the peak resonant frequency of the LRA 124 relative to other frequency components to compensate for the peak resonant frequency. This may result in the combination of the audio processor 110 and the LRA 124 having a more linear frequency response. By adapting the equalisation to compensate for the resonant peak of the LRA, the LRA 124 may be used for example as a loudspeaker for instance a receiver speaker in a mobile phone when operated in a handset mode of operation. In a handset mode of operation the LRA or speaker may only be required to transmit speech over a relatively short range for example less than 10 centimeters. The audio processor 110 may also boost signal frequency components of the audio signal which are outside the resonant frequency of the LRA 124.

The linear resonant actuator controller 100 may be implemented as a combination of hardware and software. For example, the audio processor 110 may be implemented as logic hardware or a digital signal processor running software. The haptic driver 104 and audio amplifier 118 may be implemented in hardware. The switch module 108 may be implemented as a multiplexer or other logic. In some examples, the audio input 112 and the haptic driver input 102 may be a common connection. In other examples, the LRA may be used as the only loudspeaker rather than its designed function as a haptic motor for generating vibrations. In this case, the switch and haptic driver may be omitted.

Figure 2:
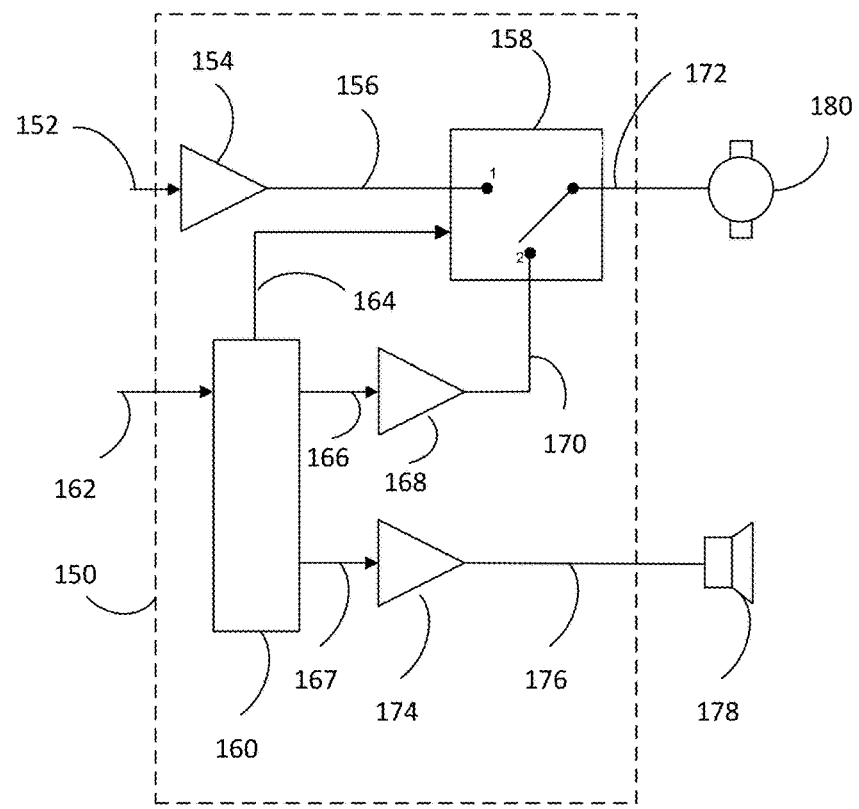
FIG. 2 illustrates a linear resonant actuator controller according to an embodiment.

FIG. 2 shows a linear resonant actuator controller 150. The linear resonant actuator controller 150 includes a haptic driver 154, a switch module 158, an audio processor 160, an audio amplifier 168 and receiver speaker audio amplifier 174. A haptic driver input 152 is connected to haptic driver or amplifier 154. The output 156 of the haptic driver 154 is connected to a first input of switch module 158. An audio input 162 is connected to audio processor 160. A first audio output 166 of audio processor 160 may be connected to an audio amplifier 168 which may for example be a class D amplifier. An output 170 of the audio amplifier 168 is connected to a second input of the switch module 158. A second audio output 167 of audio processor 160 is connected to the receiver speaker audio amplifier 174, which may for example be a class D amplifier. A further controller output 176 may be connected to the output of the receiver speaker audio amplifier 174.

An output of the switch module 158 may be connected to the controller output 172 of the linear actuator controller 150. A control output 164 of the audio processor 160 may be connected to a control input of the switch module 158.

In operation, the linear resonant actuator controller 150 may be connected to a linear resonant actuator 180 via controller output 172. The linear resonant actuator controller 150 may be connected to a loudspeaker 178 via a further controller output or receiver speaker output 176. The loudspeaker 178 may for example be a receiver speaker used in a mobile phone handset used during voice calls.

In a first mode of the linear haptic controller 150 which may be referred to as a haptic mode, the audio processor 160 may connect the haptic driver output 156 to the controller output 172 by controlling the switch module 158. In the first mode, the linear haptic controller 150 may drive the linear resonant actuator as designed, to act as a haptic motor for generating vibrations for example in a mobile phone. In a second operation mode, the audio processor 160 may connect the first audio amplifier output 170 to the controller output 172 by controlling the switch module 158. The audio processor 160 may apply a first equalisation to an audio signal to compensate for the peak resonant frequency of the LRA 180 so that the combination of the audio processor 160 and the LRA 180 has a more linear frequency response. This may allow the LRA 180 to be used, for example, as a loudspeaker.

In a separate audio path, the audio processor 160 may apply a second equalization to the audio signal before driving a connected receiver speaker 178.

The first equalization may be used to boost lower frequencies for example below 300 Hz. The second equalization may boost frequencies above 300 Hz. By processing the audio signal with a combination of a LRA 180 and a receiver speaker 178, when used in a mobile phone the quality of the audio signal, typically including speech, may be improved.

Alternatively or in addition the first equalization may be applied so that the LRA 180 is capable of reproducing the entire audio frequency spectrum, for example by increasing the gain of higher frequencies above 300 Hz.

The linear haptic controller 150 may be implemented as a combination of hardware and software. For example, the audio processor 160 may be implemented as logic hardware or a digital signal processor running software. The haptic driver 154, audio amplifier 168 and receiver amplifier 174 may be implemented in hardware. The switch module 158 may be implemented as a multiplexer or other logic.

Figure 3:
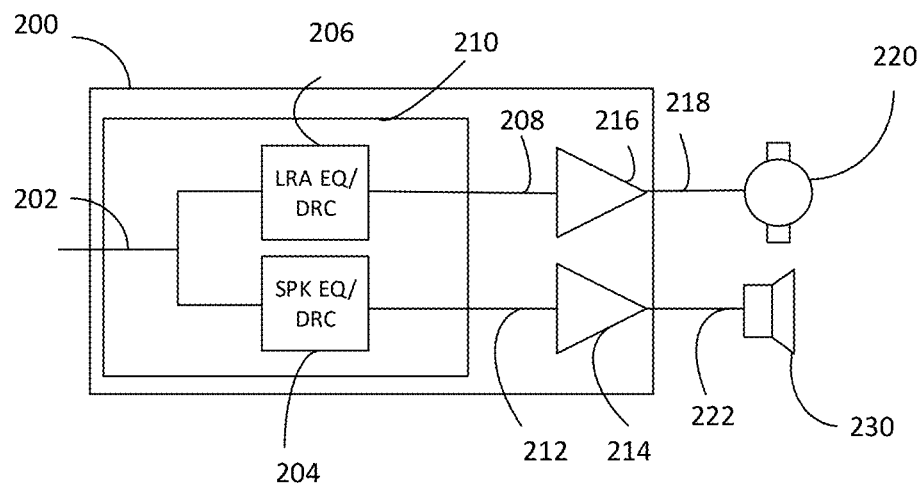
FIG. 3 illustrates a linear resonant actuator controller according to an embodiment.

FIG. 3 shows a linear actuator controller 200 including an audio processor 210, a first audio amplifier 216 and a second audio amplifier 214. The audio processor 210 includes an LRA equaliser/dynamic range controller 206 and a speaker equaliser/dynamic range controller 204. An audio input 202 may be connected to the inputs of both the LRA equaliser/dynamic range controller 206 and a speaker equaliser/dynamic range controller 204. The LRA equaliser/dynamic range controller 206 may have an output 208 connected to a LRA audio amplifier 216 which may be a class D audio amplifier. The output of the LRA audio amplifier 216 may be connected to the LRA controller output 218. The speaker equaliser/dynamic range controller 204 may have an output 212 connected to a speaker audio amplifier 214 which may be a class D audio amplifier. The output of the speaker audio amplifier 214 may be connected to the speaker controller output 222.

In operation, the LRA controller output 218 may be connected to a linear resonant actuator 220, the speaker controller output may be connected to a receiver speaker 230.

An audio signal may be received on the audio input 202 and split into two processing paths, one for the LRA 220, and one for the receiver speaker 230. The audio signal for the LRA 220, referred to as the LRA signal, may be equalised and compressed by the LRA equaliser/dynamic range controller 206. The LRA signal may be equalised and compressed to achieve a desired frequency response and to compensate for the strong resonance peak of the LRA 220. The equalization and compression may include attenuating frequency components of the audio signal occurring at the resonant frequency of an LRA with respect to some of the other frequency components. The equalization and compression may include boosting or amplifying frequency components of the audio signal at frequencies outside the resonant frequency. The audio signal received by the speaker equaliser/dynamic range controller 204 may be equalised and compressed to achieve a desired frequency response. Since the receiver speaker does not have a resonant peak, the speaker equaliser/dynamic range controller 204 may boost signal frequencies at the LRA resonant frequency to improve the low frequency response of a receiver speaker.

The equalisation filters in the LRA equaliser/dynamic range controller 206 and the speaker equaliser/dynamic range controller 204 may be used as crossover filters such that the LRA 220 may reproduce only the low frequencies for example below 300 Hz, and the receiver speaker 230 may only reproduce the high frequencies for example above 300 Hz. In some examples the receiver speaker 230 may be replaced by another audio transducer such as for example a piezo-electric audio transducer. In other examples the speaker equalizer 204 and the speaker audio amplifier 214 may be omitted. In this case an LRA may be used to reproduce all the required audio frequencies and so a receiver speaker may not be required.

Figure 4:
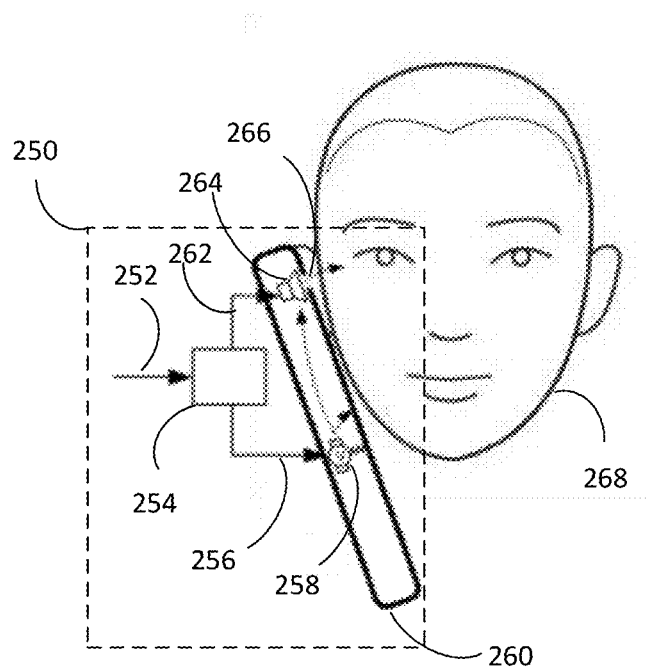
FIG. 4 shows a mobile phone including a linear resonant actuator controller, a receiver speaker and a linear resonant actuator according to an embodiment.

FIG. 4 shows a mobile phone 250 according to an embodiment. The mobile phone 250 includes a LRA 258, a housing 260, a receiver speaker 264, and a linear resonant actuator controller 254. The linear resonant actuator controller 254 is shown outside the housing 260, but it will be appreciated that typically the linear resonant actuator controller 254 may be included inside the housing 260 in addition to the receiver speaker 264 and the LRA 258. An audio input 252 may be connected to the linear resonant actuator controller 254. A controller output 256 may be connected to a linear resonant actuator 258. A speaker output 262 may be connected to a receiver speaker 264.

In a first operation mode, for example a haptic or vibrate mode, of the mobile phone 250, the linear resonant actuator controller 254 may drive the LRA 258 which generates vibrations in the housing 260 to provide haptic feedback to the user 268. In a second or handset mode of operation of the mobile phone 250, a user 268 of the mobile phone 250, typically places the handset with the receiver speaker 264 near the ear. The linear resonant actuator controller 254 may process an audio signal received on the audio input 252 by, for example, applying a first equalisation before outputting the processed audio signal on the controller output 256. In a parallel audio signal path, the linear resonant actuator controller 254 may process the audio signal by, for example, applying a second equalisation before outputting the processed audio signal on the speaker output 262. The user 268 of the mobile phone 250 may experience audio via the acoustic waves generated by the receiver speaker 264 emitted via the acoustic receiver port or aperture 266 formed in the housing 260. The user 268 of the mobile phone 250 may experience audio due to vibrations in the mobile phone housing 260 caused by the operation of the linear resonant actuator 258. These vibration frequencies will typically be low frequencies at a frequency range of below 300 Hz.

By reproducing speech using a combination of a receiver speaker 264 and the linear resonant actuator 258, the mobile phone 250 may improve the low frequency reproduction without over-driving the receiver speaker 264 and its respective amplifier (not shown). The intelligibility of speech heard by the user 268 may depend on how tightly coupled the phone is to the ear. By using the linear resonant actuator 258 in conjunction with the receiver speaker 264, the low frequency reproduction may be more stable with respect to acoustic leakage, even when the phone 250 is not in physical contact with the ear of the user 268. Furthermore, the speech may be audible even when the receiver port 266 is not located in front of the ear canal of the user 268.

In an alternative example, the linear resonant actuator 258 may be used as a complete replacement for the receiver speaker 264. In this example, the linear resonant actuator 258 may reproduce a broadband speech signal consisting of low frequencies below 300 Hz and higher frequencies above 300 Hz. The inventor of the present disclosure has appreciated that the linear resonant actuator 258 may be used in this way because at low frequencies, the linear resonant actuator 258 will induce vibrations on the mobile phone housing 260. These vibrations result in acoustic waves audible to the user 268, in particular when the mobile device 250 is close to the ear. However, at high frequencies, the linear resonant actuator or vibrator 258 may itself behave as an acoustic source due to the moving mass in the linear resonant actuator, which in turn generates a pressure field radiating through any acoustic ports and any other acoustic leaks in the mobile phone housing 260. The inventor has further appreciated that a linear resonant actuator designed specifically to generate vibrations at a specific frequency may also be used for broadband speech reduction in devices without an acoustic speaker port.

Figure 5:
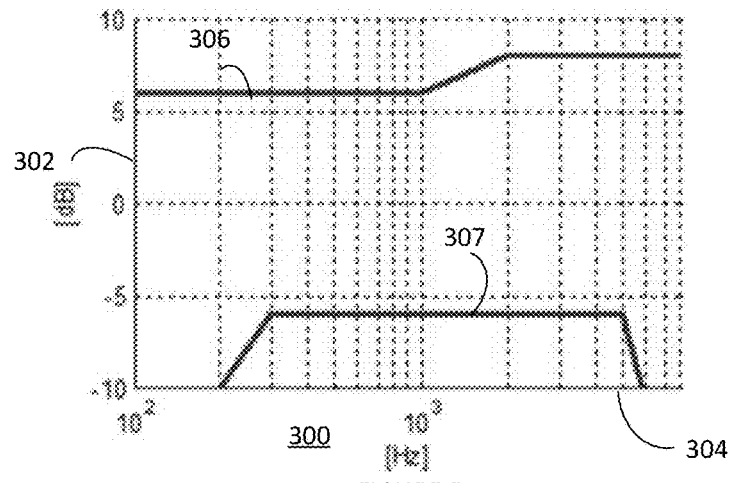
FIG. 5 shows a graph of a specified receive mask for wideband speech according to ETSI 3GPP TS 26.131 V8.3.0.

FIG. 5 illustrates the 3GPP TS 26.131 V8.3.0 release 8 mask for wideband speech 300. The x-axis 304 shows frequency in Hertz varying between 100 Hz and 8 kHz on a logarithmic scale. The y-axis 302 is in dB varying between −10 and +10 on a linear scale. The upper mask line 306 varies between approximately +6 dB at 100 Hz to +8 dB at 8 kHz. The lower mask line 307 defines the lower limit varying between approximately −10 dB at 200 Hz up to −6 dB at frequencies between 300 Hz and 5 kHz, then reducing to −10 dB at 6 kHz. The receive mask 300 is the required frequency response, which may be implemented using a well-designed receiver, also referred to as an earpiece speaker, with a sufficiently low resonant frequency and low level of distortion or total harmonic distortion (THD). The required frequency response mask also requires proper acoustic design that minimises the impact of acoustic leakage on the acoustic response, and appropriately designed equalisation filters.

Figure 6:
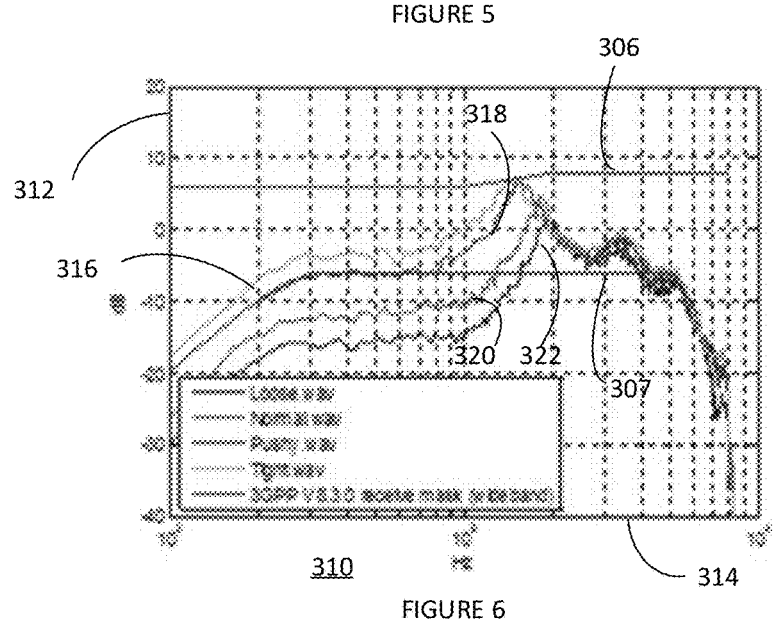
FIG. 6 shows a HATS receiver frequency response of an example smart phone for different levels of acoustical leakage.

FIG. 6 shows a response 310 of a typical receiver measured on a head and torso simulator (HATS) of a commercially available smart phone for a different acoustic leakage values. The x-axis 314 varies from a frequency of 100 Hz to a frequency of 10 kHz on a logarithmic scale. The y-axis 312 shows the variation in decibels (dB) between a value of −40 dB and +20 dB on a linear scale. The graph 310 has upper mask line 306 and lower mask line 307. The response lines 316, 318, 320, 322 illustrate the response of the phone receiver with progressively looser acoustic coupling between the earpiece speaker and the ear of the user, whereby response line 316 has the tightest acoustic coupling, and response line 322 has the loosest acoustic coupling. As can be seen, only the tightest acoustic coupling shown in the response of lines 316, and 318 are between the upper mask line 306 and lower mask line 307 of the receiver mask. In particular, the 3GPP mask requirement is not met at the lower frequencies i.e. below 1 kHz.

Figure 7:
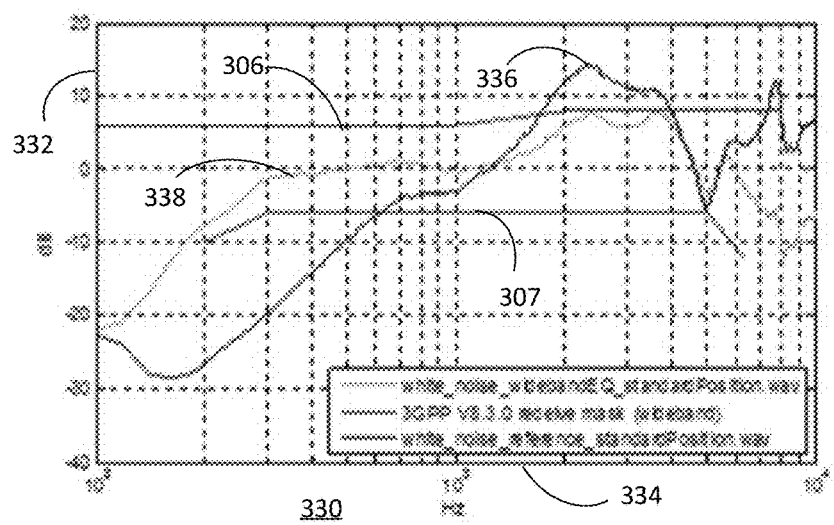
FIG. 7 illustrates a HATS frequency response of a closed-box speaker used as a receiver.

FIG. 7 shows the frequency response of a closed-box speaker 330, which is typically used in a mobile phone for hands-free mode. If such a closed-box speaker is used in handset mode as well as hands-free mode, because closed box speakers may have a higher resonant frequency than receiver speakers (typically at least twice as high), their frequency response in receive mode exhibits a severe low frequency roll-off, which the acoustic coupling with the user ear can only partially compensate. The x-axis 334 shows the frequency between 100 Hz and 10 kHz in a logarithmic scale. The y-axis 332 shows the variation in dB between −40 dB and +20 dB in a linear scale. The response of the closed box speaker without any equalisation is shown in graph line 336, and with wideband equalisation in graph line 338. An extreme low frequency boost, of up to 18 dB at 200 Hz, may be necessary to meet the 3GPP mask shown by upper mask line 306 and lower mask line 307.

Compensating the lack of low frequencies in the receive response of a mobile device operated in handset mode by aggressively boosting the low frequencies to meet the 3GPP mask may not be feasible or may be impractical for one or more of the following reasons:

The speech processor and/or receiver amplifier may not have the required headroom available to allow this boost, which may result in audible distortion due to saturation of the boosted signal in the digital or analog domain;

Driving the receiver speaker at such high drive levels may result in mechanical or thermal damage if no speaker protection mechanism is in place;

Even when being driving safely below its rated mechanical and thermal limits, the level of distortion introduced by the receiver speaker may increase significantly and reach unacceptable levels.

Moreover, the sound from a receiver speaker typically radiates through a small area, such as the grille in front of the receiver speaker, which must be placed precisely in front of the ear entrance to get a correct acoustical response.

By using the LRA in addition to or instead of a receiver speaker, the low frequency response of the mobile device to an audio signal containing speech may be improved without overdriving the receiver speaker and its amplifier.

Figure 8:
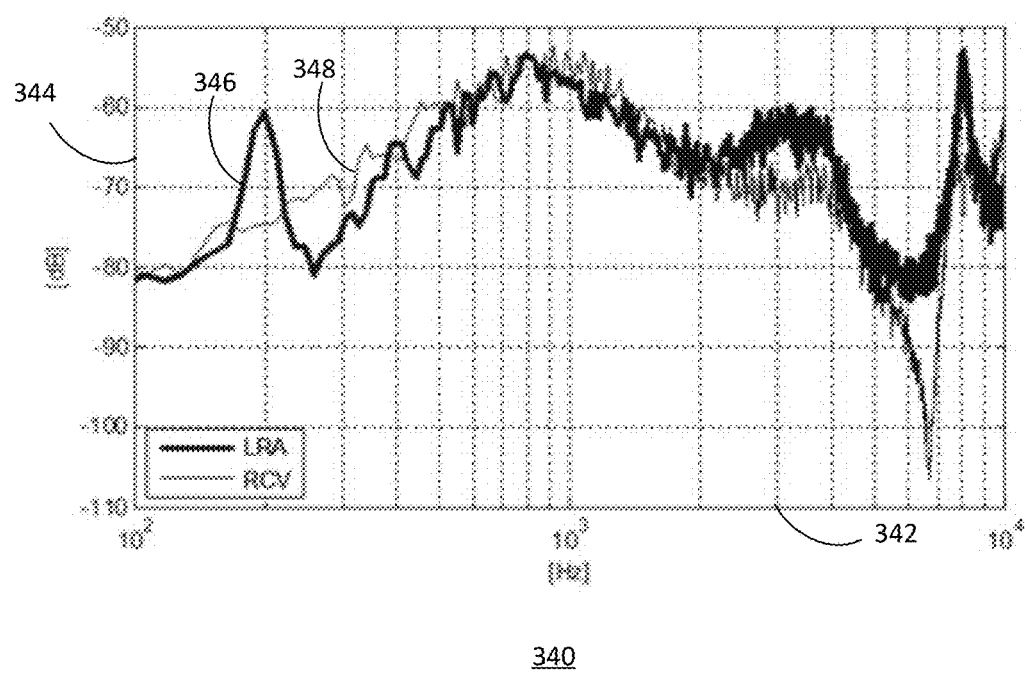
FIG. 8 shows a graph of the modified frequency response of a LRA 208 versus a receiver speaker for the mobile phone of FIG. 4.

FIG. 8 shows a graph 340 of the modified frequency response of a LRA 208 versus a receiver speaker 214 for the mobile phone 200. The x-axis 342 shows the frequency in Hertz ranging from 100 Hz to 10 kHz. The y-axis show decibels (dB) ranging from −110 dB to −50 dB. As can be seen, by applying equalization and/or compression using the linear resonant actuator controller 204, the LRA may be equalized so that the LRA response 346 is similar to the receiver speaker response 348 at frequencies of above and below 300 Hz.

By modifying the frequency response of the LRA 208, the LRA 208 may be used in addition to or instead of receiver speaker 214. In this way the speech or other audio quality perceived by the user may be improved since the LRA 208 may be more robust when the positioning of the mobile phone 200 changes with respect to the user 218. In other examples when used in a mobile phone in a hand set mode of operation, by using the LRA for speech, the vibrations induced in the housing of the mobile phone by the LRA may be transmitted via bone-conduction when the mobile phone is in contact with the head of a user. This may result in a further improvement in the intelligibility of the speech.

Figure 9:
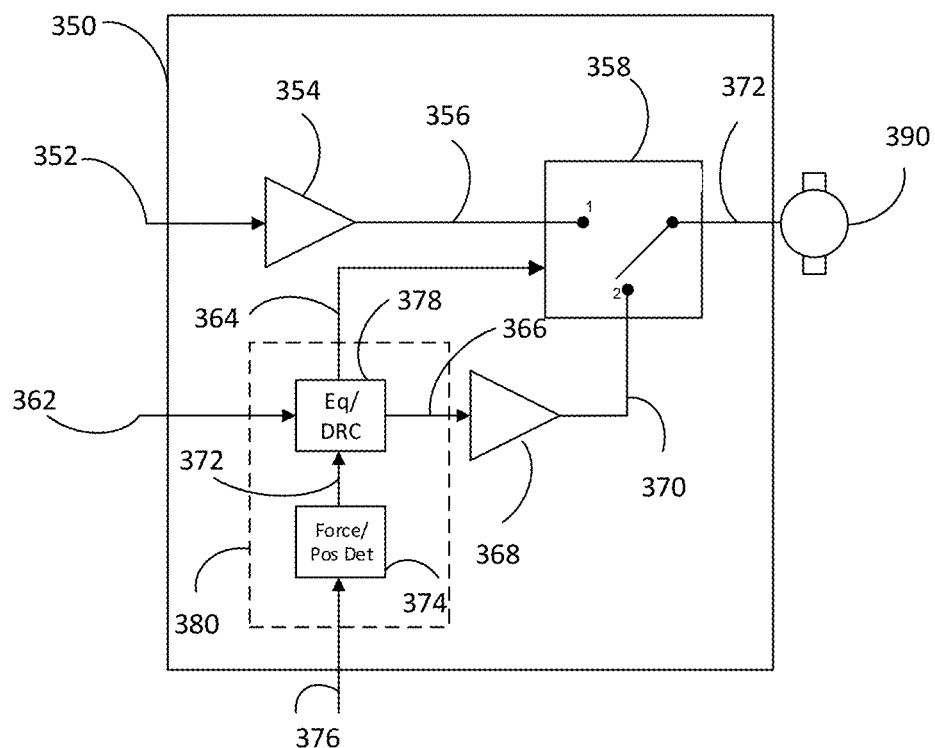
FIG. 9 illustrates a linear resonant actuator controller according to an embodiment.

FIG. 9 shows a linear resonant actuator controller 350. The linear resonant actuator controller 350 includes a haptic driver 354, a switch module 358, an audio processor 380, and an audio amplifier 368. The audio processor 380 includes an equaliser 378 and a touch detector 374. A haptic driver input 352 is connected to haptic driver or amplifier 354. The output 356 of the haptic driver 354 is connected to a first input of switch module 358. An audio input 362 may be connected to the equaliser 378. An audio output 366 of equaliser 378 may be connected to audio amplifier 368, which may for example be a class-D amplifier. A touch detector output 372 is connected to the equaliser 378. An output 370 of the audio amplifier 368 is connected to a second input of the switch module 358. The output of the switch module 358 is connected to the controller output 372 of the linear resonant actuator controller 350. A control output 364 of the equaliser 378 may be connected to control input of the switch module 358.

In a first mode of the linear resonant actuator controller 350 which may be referred to as a haptic mode, the audio processor 380 may connect the haptic driver output 356 to the controller output 372 by controlling the switch module 358. In the first mode, the linear haptic controller 350 may drive a linear resonant actuator 390 connected to the controller output 372 as designed, i.e. to act as a haptic motor for generating vibrations for example in a mobile phone. In a second operation mode, the audio processor 380 may connect the audio amplifier output 370 to the controller output 372 by controlling the switch module 358. The equaliser 378 may apply equalisation and/or compression to an audio signal to compensate for the peak resonant frequency so that the combination of the equalisation and the connected LRA 390 has a more linear frequency response.

The touch detector 374 may receive a sensor input signal on touch detector input 376 indicative of the force and/or position of contact between a mobile device user and a mobile device incorporating the linear resonant actuator controller 350. This force/position information may determine the degree of acoustic coupling between a user and the mobile device. The force and position information may be used by the equaliser 378 to modify the equalisation applied to the audio signal. Alternatively or in addition, in other examples, a proximity sensor (not shown) may provide sensor input signal including a value representing a distance between a user's ear and a mobile device. It will be appreciated that this distance value may be used to modify the equalisation applied to the audio signal by the equalizer 378.

Hence, the speech reproduced as experienced by a user may be independent of the position of the LRA 390 compared to the ear of the user By adapting the equalisation to compensate for the resonant peak of the LRA, the LRA 390 may be used for example as a loudspeaker for instance a receiver speaker in a mobile phone.

The linear resonant actuator controller 350 may be implemented as a combination of hardware and software. For example, the equalizer 378 may be implemented as logic hardware or a digital signal processor running software. The touch detector 374, the haptic driver 354 and audio amplifier 368 may be implemented in hardware. The switch module 358 may be implemented as a multiplexer or other logic.

Figure 10:
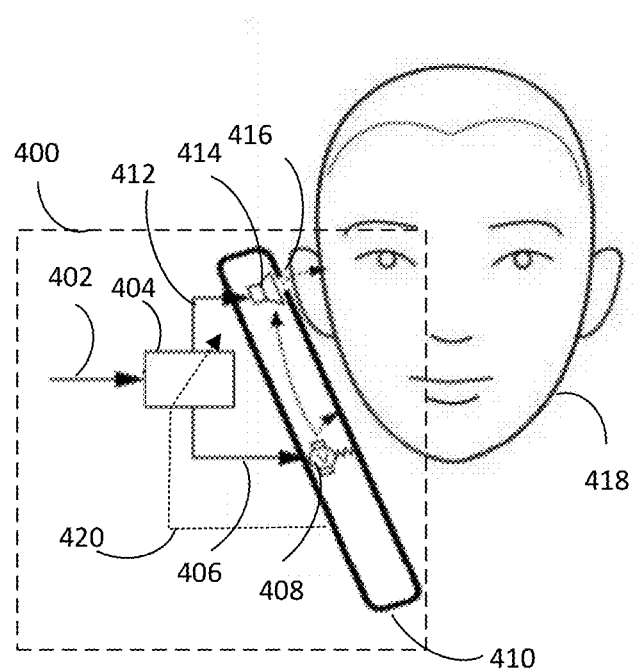
FIG. 10 shows a smart phone including a linear resonant actuator controller, a receiver speaker, a linear resonant actuator and a touch sensitive screen according to an embodiment.

FIG. 10 shows a mobile phone 400 according to an embodiment. Mobile phone 400 includes a LRA 408, a housing 410, a receiver speaker 414, and a linear resonant actuator controller 404. The linear resonant actuator controller 404 is shown outside the housing 410, but it will be appreciated that typically the linear resonant actuator controller 404 may be included inside the housing in addition to the receiver speaker 414 and the LRA 408. An input 402 may be connected to the linear resonant actuator controller 404. A controller output 406 of the linear resonant actuator controller 404 may be connected to a linear resonant actuator 408. A speaker output 412 of the linear resonant actuator controller 404 may be connected to a receiver speaker 414. The linear resonant actuator controller 404 may have a detector input 420 connected to a touch screen (not shown). The detection input may receive force and/or position information, which may be used to determine the contact between a user 418 and the mobile phone 400.

In a handset mode of operation of the mobile phone 400, a user 418 of the mobile phone 400, typically places the handset with the receiver speaker 414 near the ear. The linear resonant actuator controller 404 may process an audio signal received on the input 402 by, for example, applying a first equalisation before outputting the processed audio signal on the controller output 412. In a parallel audio signal path, the linear resonant actuator controller 404 may process the audio signal by, for example, applying a second equalisation before outputting the processed audio signal on the speaker output 412. The user 418 of the mobile phone 400 may experience audio via the acoustic waves generated by the receiver speaker 414 emitted via the aperture 416. The user 418 of the mobile phone 400 may experience audio due to vibrations in the mobile phone housing 410 caused by the operation of the linear resonant actuator 408. These vibration frequencies will typically be low frequencies at a frequency range of below 300 Hz.

By reproducing speech using a combination of a receiver speaker 414 and the linear resonant actuator 408, the mobile phone 400 may improve the low frequency reproduction without over-driving the receiver speaker 414 and its respective amplifier (not shown). The intelligibility of speech heard by the user 418 may depend on how tightly coupled the phone is to the ear. By using the linear resonant actuator 408 in conjunction with the receiver speaker 414, the low frequency reproduction may be more stable with respect to acoustic leakage, even when the phone 400 is not in physical contact with the ear of the user 418. Furthermore, the speech may be audible even when the receiver port 416 is not located in front of the ear canal of the user 418. The linear resonant actuator controller 404 may receive force/position information from the touch screen (not shown). The linear resonant actuator controller 404 may further modify the equalization applied to the audio signal in either or both of the LRA audio path and the receiver speaker audio path.

Figure 11:
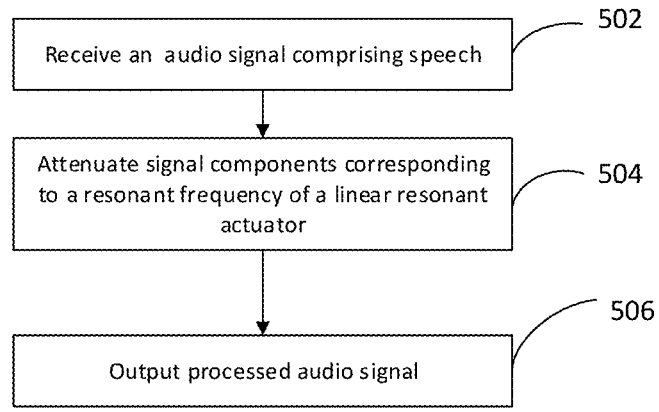
FIG. 11 shows a method of controlling a linear resonant actuator in a mobile device according to an embodiment.

FIG. 11 shows a method of controlling a mobile device including a linear resonant actuator. In step 502, an audio signal comprising speech may be received. In step 504, signal components corresponding to a resonant frequency of a linear resonant actuator may be attenuated. In step 506, the processed signal may be output for transmission by a linear resonant actuator. The processing may include for example dynamic range control, and the equalisation of the audio signal to compensate for the specific resonant frequency of the linear resonant actuator. The linear resonant actuator may typically have a very high Q factor for example a Q factor greater than 15. The equalization may include attenuating signal frequency components occurring at or close to the resonant frequency with respect to at least some other frequency components at frequencies further from the resonant frequency. The equalisation may increase the effective bandwidth of the linear resonant actuator, so allowing the LRA to be used instead of a receiver speaker, as well as its designed purpose of generating haptic feedback i.e. vibrations, which may be felt by a user of the mobile device.

Figure 12:
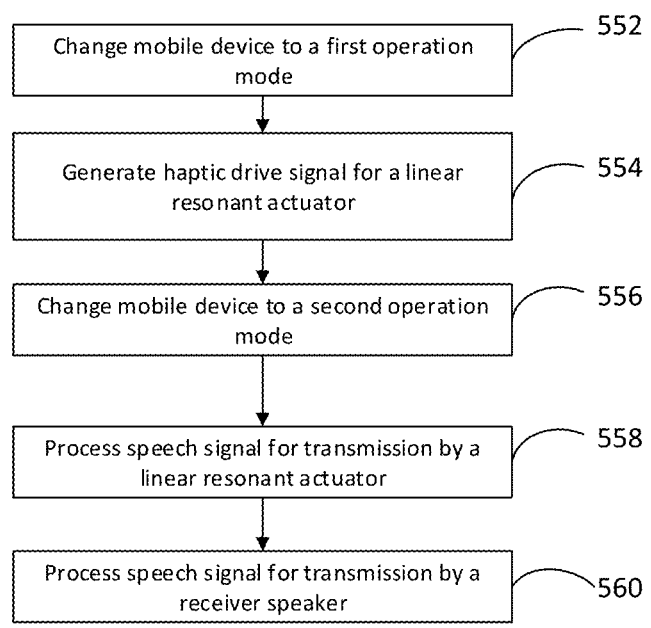
FIG. 12 illustrates a method of controlling a linear resonant actuator in a mobile device according to an embodiment.

FIG. 12 shows a method of controlling a linear resonant actuator for a mobile device 550. In step 552, a mobile device may be in a first operation mode, which may be a haptic or vibrate operation mode. In step 554, a haptic drive signal may be generated for a linear resonant actuator. In step 556, the mobile device may be changed to a second operation mode. For a mobile device, such as a mobile phone, this second operation mode may be a handset mode of operation whereby the mobile phone is used for making and/or receiving voice calls. In step 558, a speech signal in the second mode of operation may be processed for transmission by a linear resonant actuator. This processing may for example include dynamic range control and/or equalisation or other filtering. In step 560, the speech signal may be processed for transmission by a loudspeaker such as a receiver speaker in a mobile phone. By combining the speech signal output by the linear resonant actuator and the receiver speaker, the intelligibility of the speech may be improved.

The method 550 may be implemented in hardware, software or a combination of hardware and software. The method may be implemented in a mobile device such as a mobile phone or other mobile devices which output audio and include LRAs for haptic feedback such as personal digital assistants, portable medical devices, smart watches and other wearable devices, A linear resonant actuator controller for a mobile device having a linear resonant actuator is described. The linear resonant actuator controller comprises a controller output configured to be coupled to a linear resonant actuator; an audio processor having an audio processor input and an audio processor output coupled to the controller output. The audio processor is configured to receive an audio signal comprising speech, to process the audio signal by attenuating the audio signal frequency components at the resonant frequency of the linear resonant actuator with respect to at least some other audio signal frequency components, and to output the processed audio signal on the audio processor output.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A linear resonant actuator controller for a mobile device having a linear resonant actuator, the linear resonant actuator controller comprising:
   a controller output configured to be coupled to the linear resonant actuator;
   an audio processor having an audio processor input and an audio processor output wherein the audio processor output is coupled to the controller output;
   wherein the audio processor is configured
      to receive an audio signal comprising speech,
      to process the audio signal by attenuating the audio signal frequency components at a resonant frequency of the linear resonant actuator with respect to at least some other audio signal frequency components, and
      to output the processed audio signal on the audio processor output.

2. The linear resonant actuator controller of claim 1 further comprising a haptic driver having a haptic driver input and a haptic driver output;
   wherein the linear resonant actuator controller is further configured to:
      in a first mode couple the haptic driver output to the controller output,
      in a second mode couple the audio processor output to the controller output.

3. The linear resonant actuator controller of claim 1 wherein the audio processor is configured to equalize and compress the audio signal before output on the audio processor output.

4. The linear resonant actuator controller of claim 1 further comprising a further controller output configured to be coupled to one of a receiver speaker and a piezo-transducer,
   wherein the audio processor comprises a further audio processor output coupled to the further controller output and
   wherein the audio processor is further configured to process the received audio signal and to output a further processed audio signal on the further audio processor output.

5. The linear resonant actuator controller of claim 4:
   wherein the audio processor is configured to generate the processed audio signal by applying a first equalization and compression to the audio signal and to generate the further processed audio signal by applying a second equalization and compression to the audio signal.

6. The linear resonant actuator controller of claim 5 wherein the first equalization and compression comprises a low pass filter and the second equalization and compression comprises a high pass filter.

7. The linear resonant actuator controller of claim 1,
   wherein the audio processor further comprises: a sensor input configured to receive a sensor signal comprising at least one of a user contact position value, a user proximity value, and a user contact force value,
   wherein the audio processor is further configured to adapt the audio signal processing in dependence of the sensor signal.

8. A mobile device
   comprising the linear resonant actuator controller of claim 1, and
   further comprising the linear resonant actuator coupled to the controller output.

9. A mobile device
   comprising the linear resonant actuator controller of claim 5, and
   further comprising the linear resonant actuator coupled to the controller output and one of the receiver speaker and the piezo transducer coupled to the further controller output.

10. A mobile device
    comprising the linear resonant actuator controller of claim 7, and
    further comprising the linear resonant actuator coupled to the controller output and a touch screen coupled to the sensor input,
    wherein the touch screen is configured to provide the sensor signal comprising at least one of a use contact position value and a user contact force value in response to a user being in contact with the touch screen.

11. The mobile device of claim 8 wherein the linear resonant actuator has a Q-factor of greater than 15.

12. A method for controlling a mobile device including a linear resonance actuator, the method comprising:
    processing an audio signal comprising speech for transmission by the linear resonant actuator by attenuating the audio signal frequency components at a resonant frequency of the linear resonant actuator with respect to at least some other audio signal frequency components.

13. The method of claim 12 further comprising
    processing the audio signal for transmission by a receiver speaker.

14. The method of claim 12
    wherein processing the audio signal further comprises equalising and compressing the audio signal.

15. The method of claim 14,
    wherein processing the audio signal further comprises:
        applying a first equalization and compression to the audio signal before transmission by the linear resonance actuator,
        applying a second equalization and compression to the audio signal before transmission by a receiver speaker,
        wherein the first equalization comprises a low pass filtering operation and the second equalization comprises a high pass filtering operation.

* * * * *